United States Patent [19]
von Klitzing et al.

[11] Patent Number: 5,332,911
[45] Date of Patent: Jul. 26, 1994

[54] SEMICONDUCTOR COMPONENT WITH ADIABATIC TRANSPORT IN EDGE CHANNELS

[75] Inventors: Klaus von Klitzing, Stuttgart; Gerhard Mueller, Meitingen; Edgar Diessel; Dieter Weiss, both of Stuttgart, all of Fed. Rep. of Germany

[73] Assignee: Max-Planck-Gesellschaft zur Foerderung der Wissenschaften, e.V., Goetting, Fed. Rep. of Germany

[21] Appl. No.: 822,299

[22] Filed: Jan. 17, 1992

[30] Foreign Application Priority Data

Jan. 18, 1991 [DE] Fed. Rep. of Germany ....... 4101389

[51] Int. Cl.$^5$ .................. H01L 27/14; H01L 31/00
[52] U.S. Cl. .................. 257/187; 257/184; 257/194; 257/425; 257/431
[58] Field of Search .......... 257/26, 29, 184, 187, 257/194, 195, 421, 425, 431

[56] References Cited

U.S. PATENT DOCUMENTS 4,740,823  4/1988  Thompson ............... 257/184
5,144,580  9/1992  Niu et al. .................. 257/184

Primary Examiner—Sara W. Crane
Attorney, Agent, or Firm—Townsend and Townsend Khourie and Crew

[57] ABSTRACT

A semiconductor radiation detector with layer-wise construction and a conductive region having a two-dimensional or quasi one-dimensional electron or hole gas is provided in which adiabatic transport in edge channels occurs at least regionally and in which at least two contacts are provided to this conductive region. The transport in the edge channels is disturbed by interaction with the electromagnetic radiation to be detected, i.e. an increase of the scattering rate between the edge channels is caused. This leads to a change of the resistance measurable between the contacts, with a means being provided for measuring the change of resistance to thereby detect the incident radiation.

38 Claims, 10 Drawing Sheets

SEMICONDUCTOR COMPONENT WITH ADIABATIC TRANSPORT IN EDGE CHANNELS

BACKGROUND OF THE INVENTION

The present invention relates to a semiconductor component with adiabatic transport in edge channels and relates in particular to a semiconductor radiation detector, above all for the detection of electromagnetic radiations in the far infrared region.

For the detection and observation of electromagnetic radiations in the region of the far infrared (50 $\mu$m to 1000 $\mu$m) two types of detectors are known in the prior art. The first type includes Si and Ge bolometers in which the detection mechanism relates to non-resonant thermal absorption at low temperatures T of approximately 1.6K. Such bolometers have a time constant, i.e. a time resolution of approximately 1 ms and an NEP (noise equivalent power) of approximately $10^{-14}$ Watt/$\sqrt{Hz}$. Special bolometers of this kind are obtainable from the company Infrared Laboratories, Inc., Tucson, Ariz., USA.

The second type of far infrared detectors are pyroelectric detectors in which the detection method relates to a non-resonant heating of a pyroelectric crystal at room temperature. Here the time constant is approximately 0.2 ms and the NEP is about $8 \times 10^{-10}$ Watt$\sqrt{Hz}$. Such detectors are available commercially, for example in the form of the model 404 from Eltec Instruments S.A., Zurich, Switzerland.

The most serious disadvantages of Si and Ge bolometers lie in the lack of tunability which originates from the non-resonant thermal absorption and the time constants which are large for the same reason. The value of 1 ms does not permit any temporally highly resolved spectroscopy. For the physical detection of far infrared radiations very much shorter time constants are desirable. Bolometers are furthermore not integratable onto a chip as a result of their size and the principle of construction that is used. The mechanical stability of bolometer designs also leaves something to be desired.

In analogy to bolometers pyroelectric detectors are also relatively ill-suited for spectroscopic purposes because they cannot be tuned through a range of frequencies.

The material involved in the principle of design of pyroelectric detectors also does not permit integration with an electronic evaluation circuit on a chip. The detector only reacts to changing radiation intensity and can thus only be operated with modulation.

The object of the present invention is thus to provide a novel radiation detector which is in particular suited for the far infrared region, but can also be used for shorter and longer wavelengths, and which can be realized by semiconductor technology so that integration onto a chip is possible, for example together with the requisite electronic evaluation circuit. Furthermore, the detector should have a higher NEP and a shorter time constant in comparison to the known detectors and it should preferably also be tunable through a range of wavelengths and/or so designed that radiations of different wavelengths can be detected with one detector unit.

SUMMARY OF THE INVENTION

In order to satisfy this object by means of a semiconductor component with adiabatic transport in edge channels the solution of the invention is characterized by the use of the semiconductor component as a semiconductor radiation detector in which the adiabatic transport is disturbed by interaction with the electromagnetic radiation to be detected, i.e. an increase of the scattering rate between the edge channels is caused, that is to say an increase of the inter edge channel scattering, and by a means for detecting this disturbance or increase through detection of the change of resistance which occurs.

More precisely stated the present invention relates to a semiconductor radiation detector with layer-wise construction and a conductive region having a two-dimensional or quasi one-dimensional electron or hole gas in which an adiabatic transport takes place at least originally in edge channels (also termed edge states) and also with at least two contacts to this conductive region, with the transport in the edge channels being disturbed by interaction with the electromagnetic radiation to be detected, i.e. with an increase of the scattering rate between the edge channels being caused, which leads to a change of the resistance measurable between the contacts which can be detected with known measurement methods.

Adiabatic transport in two-dimensional electron gases (2DEG) and the occurring change of resistance during the transition to so-called equilibrated transport is known per se and is for example described in the article "Edge channels and the role of contacts in the quantum Hall-regime" in Physical Review B, Vol. 42, No. 12 of Oct. 15, 1990 by G. Müller, D. Weiss, S. Koch and K. von Klitzing and also by H. Nickel, W. Schlapp and R. Lösch. There the change of resistance is realized by the application of suitable potentials to the gate electrodes that are provided which leads to a change of the filling factors and thus the number of the occupied edge channels (edge states) beneath the gate electrodes, and indeed independently of the filling factor in the material not influenced by the gate.

As can be read in the said article the Landauer-Büttiker model has been successfully applied in recent time in connection with the quantum Hall effect in order to describe the quantized resistance values which arise. Within this picture the transport in strong magnetic fields and at low temperatures is governed by one-dimensional channels at the boundaries of the two-dimensional electron gas (2DEG). These channels are formed by the intersection of the Fermi energy with the bent-up (due to confining potential) Landau-levels at the edges of the device. Classically considered these edge states correspond to skipping orbits moving along the edges in opposite directions on opposite sides of the sample. The number of the occupied edge channels is given by the filling factor in the 2DEG. A net current I flows due to a difference in the electrochemical potential $\Delta\mu$ between two sides of the Hall structure (Hall bar). Backscattering from one side of the sample to the other is the reason for dissipation and therefore finite resistance in this model.

The electrochemical potential of the edge channels is determined by the contacts, the current, the magnetic field and the gate electrodes. If all available edge channels are occupied up to the same electrochemical potential (on one side of the sample) with each channel carrying the same current then one speaks of equilibrated transport. In contrast the transport with a dissimilar distribution of the current between the edge channels is termed adiabatic transport. The measured resistance changes depend on whether the transport is adiabatic or equilibrated. The measurement of this resistance can for example be effected as a customary 4-point-resistance measurement as can be read in the cited article, A 2-point--resistance measurement is also possible.

For the sake of brevity the content of the named article will not be described further here, The content of the article is however incorporated by this reference into this application.

The starting point for the present invention is thus the concept of adiabatic transport (absence of scattering between the selectively occupied one-dimensional edge channels in high mobility two-dimensional electron and hole gases), The invention is thus based on the special recognition that the absorption of photons (photon energy approximately the same as the cyclation resonance energy) in a semiconductor component of this kind leads to a coupling of the selectively occupied edge channels, i.e. to a transition from adiabatic to equilibrium transport which brings about a pronounced change of the resistance which can be evaluated as an indication of the detection of the incident radiation. The conditions for an adiabatic transport at low temperatures can for example be realized by means of Schottky gates.

The inventive concept described here has already been successfully tested with AlGaAs/GaAs heterostructures and it has been shown that far infrared detection is possible with the radiation detector in accordance with the invention. The time constant of the measurements carried out with the radiation detector of the invention is at least a factor 1000 smaller than the time constant of known Si and Ge bolometers so that temporally highly resolved spectroscopy is possible with the radiation detector of the invention. The sensitivity is at least an order of magnitude better than the sensitivity of pyroelectric detectors so that detectors in accordance with the invention are best suited for far infrared astronomy, far infrared solid state spectroscopy, far infrared molecular spectroscopy and time resolved far infrared spectroscopy. Application possibilities for spatially resolved far infrared detection are also in sight. Furthermore, a radiation detector in accordance with the invention is absolutely predestined for integration onto a chip (electronic evaluation circuit and detector on one GaAs chip).

Although the operation of the detector of the invention would be conceivable without an applied magnetic field (with lateral constriction of the channels, which will be explained later), a particularly preferred practical embodiment is characterized by a means for generating a magnetic field which has at least one component and which can be applied perpendicular to the electron or hole gas, i.e. to the layers of the semiconductor component. In the non-irradiated state of the detector the magnetic field namely brings about a reduction of the scattering between the edge channels so that the resulting change and resistance at the transition into the irradiated state becomes even higher. On using the semiconductor radiation detector for the detection of a radiation of a given wavelength the strength of the said component of the magnetic field lies in the range up to approximately 15 Tesla, in particular at approximately 3 Tesla.

Through change of the strength of the said component of the magnetic field the frequency sensitivity of the radiation detector is displaced. In other words the semiconductor radiation detector in accordance with the invention can be tuned. A special embodiment of such a radiation detector is thus characterized in that a means is provided for changing the strength of the magnetic field or of the said components of the latter.

The means for generating the magnetic field is preferably a coil, with the conductive region of the detector preferably lying transverse to the axis of the coil in the immediate vicinity of the coil and thus within homogenous magnetic field. The coil is preferably a superconducting coil.

The semiconductor detector of the invention must namely be operated at low temperatures, for example at a temperature of approximately 4° K, preferably of approximately 1.3° K, so that the operating temperature is already so low that superconducting materials can be used without additional complexity of note. Such superconducting coils have moreover the advantage that the thermal dissipation is essentially zero, so that the cryostat which is necessary for these low temperatures is not unnecessarily burdened. The current in the superconducting coil can be induced once on starting the operation of the detector and can then remain in the coil until the measurements have been completed.

In the simplest embodiment the semiconductor radiation detector of the present invention is characterized in that the said contacts are formed by first and second contacts which are provided with a spacing from one another at respective ends of the conductive region, with at least one gate electrode being provided which is arranged between the first and the second contacts and covers over a part of the length of the conductive region.

The contacts serve for carrying out the required resistance measurement, while the gate electrode determines the filling factor in the underlying part of the conductive region. Even better is an arrangement in which a second gate electrode is provided which is arranged at a distance from the first gate electrode and likewise covers over the conductive region over a further part of its length, with the adiabatic transport being realized between the gates.

It is of advantage when at least one further gate electrode and preferably several gate electrodes are arranged at regular intervals over the length of a conductive region and preferably all have the same potential, for example in that they are connected together. Through the plurality of gate electrodes the resulting change in resistance and thus also the sensitivity of the detector is increased.

It is in particular preferable when the gate electrodes form a periodically applied gate structure which then serves as a grid coupler and brings about a pronounced change in resistance through magnetoplasmon coupling of the edge channels.

Through the application of a predeterminable potential to an additional gate electrode provided on the rear side of the sample the detector can also be tuned through the envisaged frequency range. This thus represents an alternative to achieving tunability through changing of the magnetic field. It can however also be useful to change both the gate potential and also the strength of the magnetic field.

Although only two ohmic, i.e. non-ordered, contacts are ultimately sufficient in order to measure the resistance of the conductive region two further contacts are preferably provided, whereby a known 4-point-measurement of the resistance of the conductive region can be carried out. In this way the accuracy of the measurement is increased.

A plurality of detectors in accordance with the invention can with advantage be built up on one chip. In this way it is, for example, possible to provide a certain redundancy so that on failure of the one detector a switch can be made to a further detector by means of a suitable circuit.

It is particularly favorable when a plurality of detectors are formed on one chip and individual detectors are laid out to detect radiation of different wavelengths. This can for example be achieved by the use of gate structures with different dimensions or periodicity through magnetoplasmon coupling, and/or by applying different gate potentials and/or by applying different magnetic fields and/or by the use of non-homogeneous magnetic fields.

As already indicated provision is made in accordance with the invention that the means for carrying out the resistance measurement and for the applying of control potentials to the chip are integrated onto the chip.

The coil for generating the magnetic field can likewise be integrated onto the chip, preferably in the form of a superconducting loop. A window which permits access of the radiation to the conductive region is also important.

Although the radiation detector of the invention can be realized with all semiconductor systems in which a two-dimensional electron or hole gas or a quasi one-dimensional electron or hole gas can be realized, i.e. in all known II-VI, III-V or IV-VI compositional semiconductors or in silicon or germanium semiconductors, preference is given in accordance with the invention to the $GaAs/Al_xGa_{1-x}As$ compositional semiconductor system. A semiconductor radiation detector in accordance with this system is characterized by the following layer build-up:

a buffer layer arrangement and an intrisic GaAs layer with a thickness in the $\mu$m-range are first grown on a GaAs substrate by epitaxy, preferably by molecular beam epitaxy, an undoped $Al_xGa_{1-x}As$-spacer with a layer thickness in the 100Å-range is grown onto the intrisic undoped GaAs layer, followed by a further layer of the same material but with an impurity doping having a three-dimensional concentration of preferably $2-7 \times 10^{18} cm^{-3}$, preferably in the form of a homogeneous doping or in the form of a delta doping (for example in accordance with U.S. Pat. No. 4,882,609), wherein a cover layer of undoped GaAs is grown onto this doped layer, and wherein the contacts to the 2DEG and also the gate electrodes are produced following photolithographic delimitation of the conductive region, in which the undesired regions are removed to a level beneath the two-dimensional electron gas which forms in the boundary region between the undoped GaAs layer and the $Al_xGa_{1-x}As$-spacer.

DESCRIPTION OF THE PREFERRED EMBODIMENTS

Figure 1:
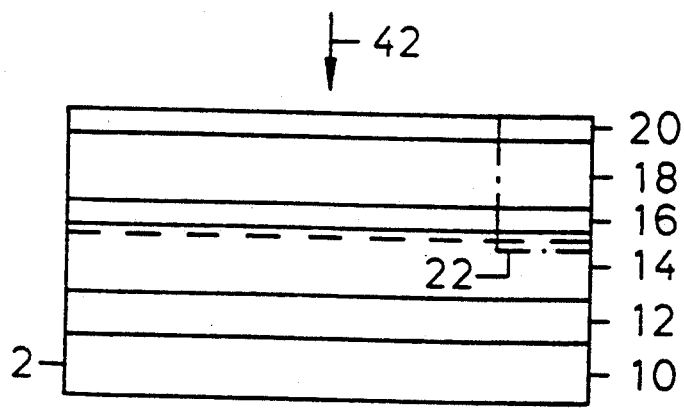
FIG. 1 is a schematic illustration of the layer build-up of a semiconductor radiation detector in accordance with the invention.

FIG. 1 firstly shows the layer build-up of a semiconductor radiation detector 2 in accordance with the invention. As shown there a buffer layer arrangement 12 is first build-up by means of MBE on an insulated GaAs substrate 10 in order to provide a clean crystal structure and to prevent any impurities in the substrate from creeping into the active region of the semiconductor. Such buffer layer arrangements are well known, and are thus not be explained here in further detail. A further layer 14 of undoped gallium arsenid is deposited on the buffer layer arrangement 12 and has a layer thickness of approximately 2 $\mu$m. This layer 14 is followed by a spacer layer 16 comprising a nondoped $Al_{0.25}Ga_{0.75}As$ spacer with a layer thickness of approximately 200Å. On this spacer layer a further layer of the same composition is then likewise deposited by MBE, i.e. a layer of $Al_{0.25}Ga_{0.75}As$ with the layer thickness of for example 400 Å. This layer 18 is however a doped layer the task of which is to make available charge carriers in the form of electrons for the GaAs layer 14, so that these electrons form a two-dimensional electron gas adjoining the transition to the spacer layer 16. For this purpose the layer 18 is a doped layer and can for example be an homogeneously doped layer, or a Dirac-Delta doped layer such as is for example described in U.S. Pat. No. 4,882,609. In both cases the surface concentration of the impurity atoms (silicon) is approximately $\approx 2.10^{13} \text{cm}^{-2}$. A terminal layer of undoped GaAs is then present on the layer 18.

Figure 2:
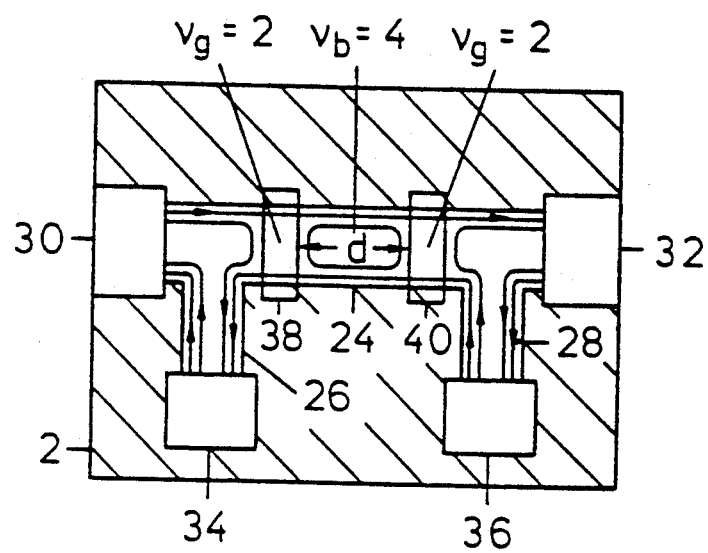
FIG. 2 is a plan view of the radiation detector of FIG. 1 after completed etching and application of the contacts and gate electrodes.

After growing the different layers by MBE the chip is etched by means of a photolithographic process known per se in order to generate a semiconductor component with the topography for example of FIG. 2. The etching process is carried out in such a way that the chip is etched away down to the level 22, i.e. to a level beneath the 2DEG. The etched surface is illustrated with hatched lines in FIG. 2 (and also in the further FIGS. 3 to 8). There thus remains a bar 24 with two downwardly projecting transverse limbs 26 and 28, with the bar 24 projecting to the right and to the left beyond the limbs 28 and 26. As the two-dimensional electron gas extends beyond bar 24 into the limbs 26 and 28 a conductive connection exists between these regions.

Next of all first and second contacts 30 and 32 are provided to the respective ends of the bar and third and fourth contacts 34, 36 are provided to the respective free ends of the limbs 26, 28. Moreover two gate electrodes 38 and 40 are provided which are arranged spaced apart from one another above the central region of the bar 24. The four contacts 30, 32, 34, 36 are ohmic contacts of metal (AuGe/Ni) to the 2DEG. The two gates 38, 40 are in contrast Schottky gates which respectively consist of a 20 Å thick layer of a NiCr alloy and a 1000 Å thick layer of gold.

The ohmic contacts are defused into the crystal during a thermal treatment. The NiCr/Au Schottky gates are subsequently vapor-deposited onto the crystal.

The spacing d between the gate electrodes 38, 40 can be substantially shorter than the wavelength q to be detected, from which it can be seen how small the dimensions of the component itself can be. In the illustrated embodiment, d amounted to 50 μm. The electron concentration in the 2DEG amounted to $2.71 \times 10^{11}/\text{cm}^2$ and the mobility was measured at 560,000 cm²/Vs.

In operation the semiconductor component in accordance with FIGS. 1 and 2 is placed in a cryostat at a temperature of preferably 1.3° K and a 4-point-resistance measurement is effected via the contacts 30, 32, 34 and 36, and indeed preferably in a magnetic field which penetrates in the direction of the arrow 42 of FIG. 1 through the conductive region of the bar 24., i.e. a magnetic field which lies perpendicular to the plane of FIG. 2.

When the strength of the magnetic field is matched in accordance with the cyclotron resonance conditions to the wavelength to be detected then a pronounced change of resistance is determined between the non-irradiated state of the semiconductor radiation detector (low resistance) and the irradiated state (increased resistance). Instead of operating with a predetermined magnetic field strength one can change the strength of the magnetic field, for example in the region up to approximately 15 Tesla, whereby the detector becomes tunable, i.e. can be tuned to different frequencies. It is necessary to apply special potentials to the gate electrodes 38, 40. The application of such potentials makes it possible to change the number of occupied edge states (edge channels) beneath the gate electrodes which in accordance with the theory has effects on the measured resistance.

The use of such control potentials also makes it possible to set the resistance values in the desired regions and above all enables a pronounced change of resistance between the irradiated and the non-irradiated states.

As set forth in the named article in the Physical Review B, volume 42, No. 12 of Oct. 15, 1990 the 4-point-resistance in the non-irradiated state comprises:

$$R^{ad}_{30,32;34,36} = \frac{h}{e^2}\left(\frac{1}{\nu_g} - \frac{1}{\nu_b}\right) \quad (A)$$

with $\nu_g$ being the filling factor beneath the Schottky gate electrodes and $\nu_b$ the filling factor in the bar region beneath the gate electrodes, i.e. in the non-gated region. The designations R, h and e have the usual meaning. Furthermore $\nu$ is given by the following equation:

$$\nu = hN_s/eB \quad (B)$$

with B being the strength of the magnetic field perpendicular to the 2DEG and $N_s$ being the electron density. The above quoted equation for the resistance applies as long as the transport is completely adiabatic. For a change of this transport into equilibrated transport, i.e. in the non-radiated state of the semiconductor radiation detector the following equation then applies:

$$R^{eq}_{30,32;34,36} = \frac{2h}{e^2}\left(\frac{1}{\nu_g} - \frac{1}{\nu_b}\right) \quad (C)$$

(when the number of gate electrodes is 2).

Figure 3:
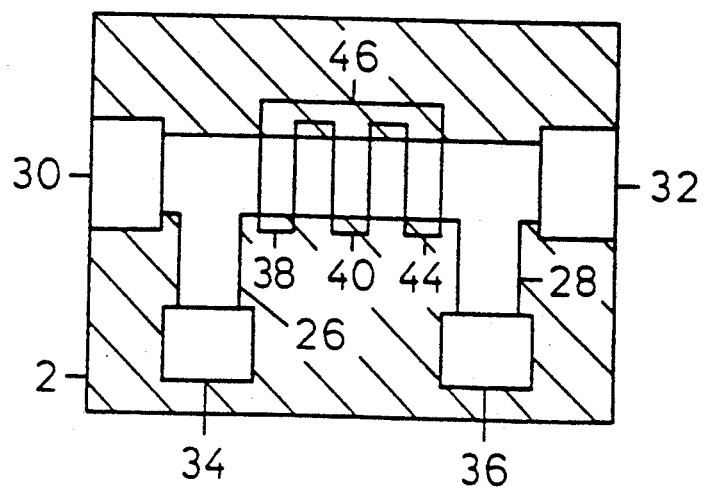
FIG. 3 is a schematic illustration similar to that of FIG. 2 but of a modified embodiment of a radiation detector in accordance with the invention.

FIG. 3 shows that the invention is in no way restricted to only two gate electrodes. Accordingly three gate electrodes are used in FIG. 3 which are all manufactured with a common connection electrode so that all gate electrodes have the same potential. This is however not necessary. The gate electrodes could be provided with different potentials which would be possible by the omission of the connection electrode.

Figure 4:
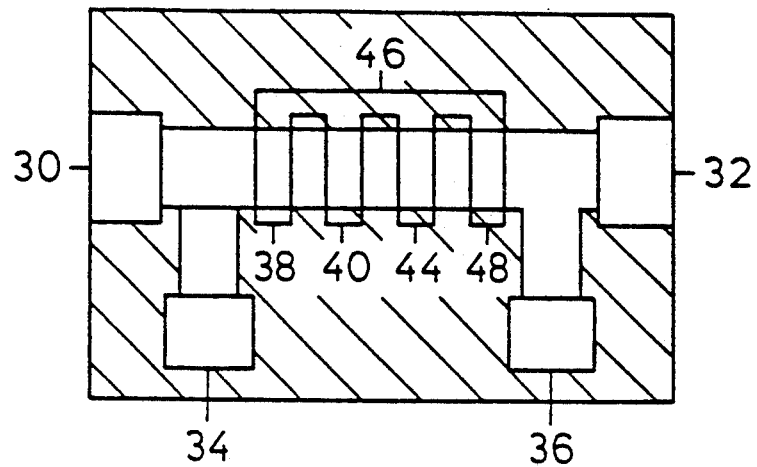
FIG. 4 is a further representation similar to FIGS. 2 and 3, but of a further inventive embodiment of the radiation detector.

FIG. 4 shows an alternative embodiment, with four gate electrodes 38, 40, 44 and 48 which are in turn connected electrically to one another, in this example via a connection electrode 46.

Figure 5:
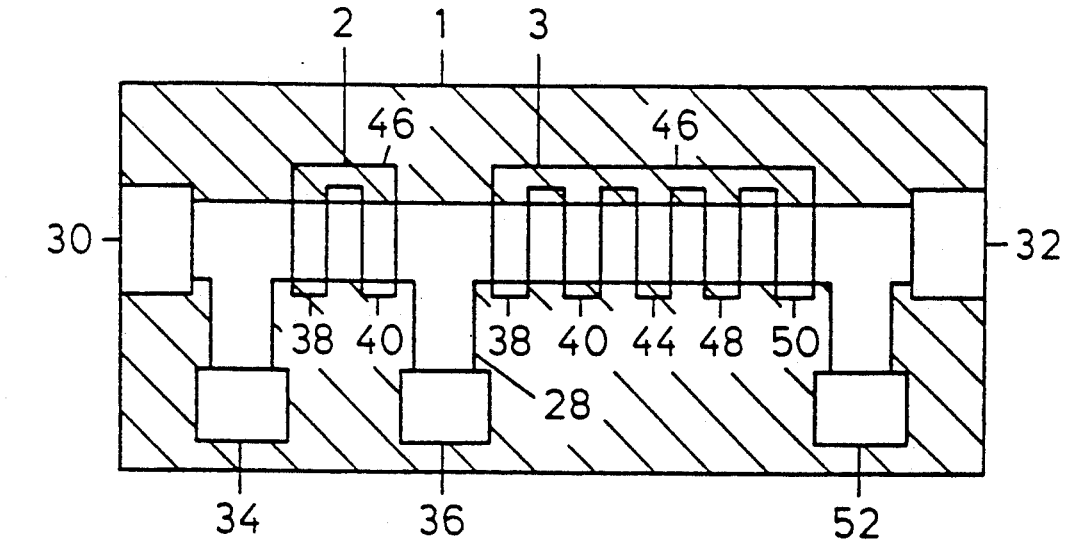
FIG. 5 is a schematic illustration of two radiation detectors in accordance with the invention integrated onto a chip.

FIG. 5 shows an example with two semiconductor radiation detectors in accordance with the invention which are formed on a common chip 1. Here the detector 2 is formed in accordance with the detector of FIG. 2 with the distinction that in this case a common connection electrode 46 is provided between the two gate electrodes 38 and 40. The second semiconductor radiation detector 3 is formed approximately in accordance with the radiation detectors of FIGS. 3 and 4 but with five gate electrodes 38, 40, 44, 48 and 50. The number of gate electrodes can be substantially higher than five without restriction. These gate electrodes are connected together by a common electrode 46.

One notes that the two radiation detectors 2 and 3 have a common limb 28, i.e. it is not necessary to provide a separate limb 28 for each detector. It is likewise not necessary to provide first and second contacts for each detector, but rather first and second contacts 30 and 32 can be common to the two detectors, as shown here. For the measurement of the 4-point resistance for the detector 2 the contacts 30, 32, 34 and 36 are thus used in the embodiment of FIG. 5. For the measurement of the 4-point-resistance the contacts 30, 32, 36 and 52 are used for the detector 3.

FIG. 5 shows a further special feature. The gate electrodes 38, 40, 44, 48, 50 with a common connection electrode 46 form a periodic gate structure which leads, under the influence of the magnetic field that is used, to an excitation by the radiation to be detected of magnetoplasmons which are formed in the structure. A more pronounced change of resistance is caused by the coupling of the edge states via magnetoplasmons, so that the sensitivity of the measurement is increased.

Figure 6:
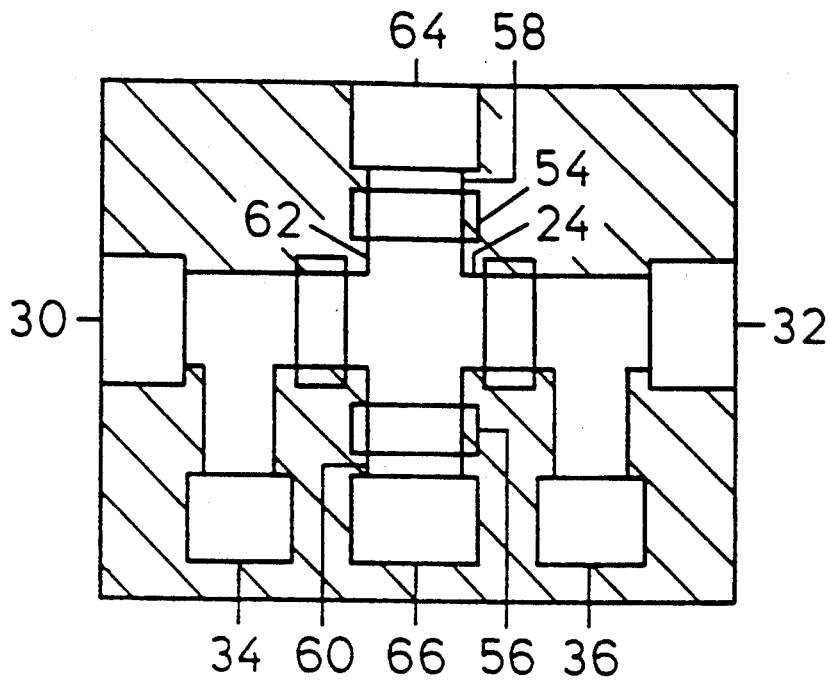
FIG. 6 is a schematic illustration similar to the FIG. 2 of a radiation detector in accordance with the invention which is laid out for the carrying out of a Hall resistance measurement.

An alternative measurement is possible with the arrangement of FIG. 6 in which the semiconductor radiation detector is laid out so as to carry out a measurement of the Hall resistance in accordance with the proposal in the named article in Physical Review B, vol. 42, No. 12 of Oct. 15, 1990. Here two further gate electrodes 54 and 56 are provided in addition to the gate electrodes 38 and 40 of FIG. 2, are likewise formed as Schottky electrodes and are arranged on respective limbs 58, 60 of a transverse bar 62, with the two-dimensional electron gas extending from the bar 24 into the limbs 58, 60 of the transverse bar 62. Two further contacts 64 and 66 are provided at the free ends of the respective limbs and serve during the resistance measurement as Hall sensors. The further gate electrodes 54 and 56 serve to electrically couple in or decouple the Hall sensor contacts 64, 66.

Figure 7:
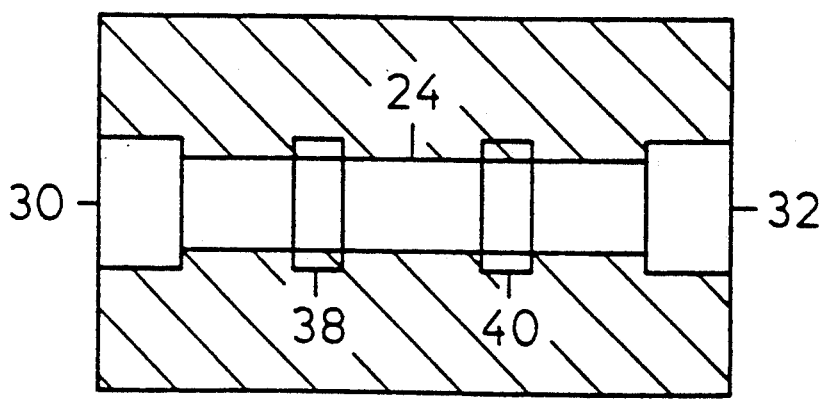
FIG. 7 is a further illustration of a radiation detector in accordance with the invention similar to the detector of FIG. 2 but for carrying out a 2-point-resistance measurement.

A less precise, but also less complex solution for the measurement of the resistance of the conductive region 24 is shown in FIG. 7. The semiconductor radiation detector of FIG. 7 namely has two contacts 30 and 32 which are arranged at respective ends of the bar 24. In this case two gate electrodes 38 and 40 are provided; this does not however represent a restriction. Thus, only one gate electrode can be provided or alternatively a plurality of gate electrodes can also be connected together in accordance with FIG. 5 to form a periodic gate structure. It is important that a free part of the conductive region is present, i.e. a part of this region which is not covered by a gate electrode.

Figure 8:
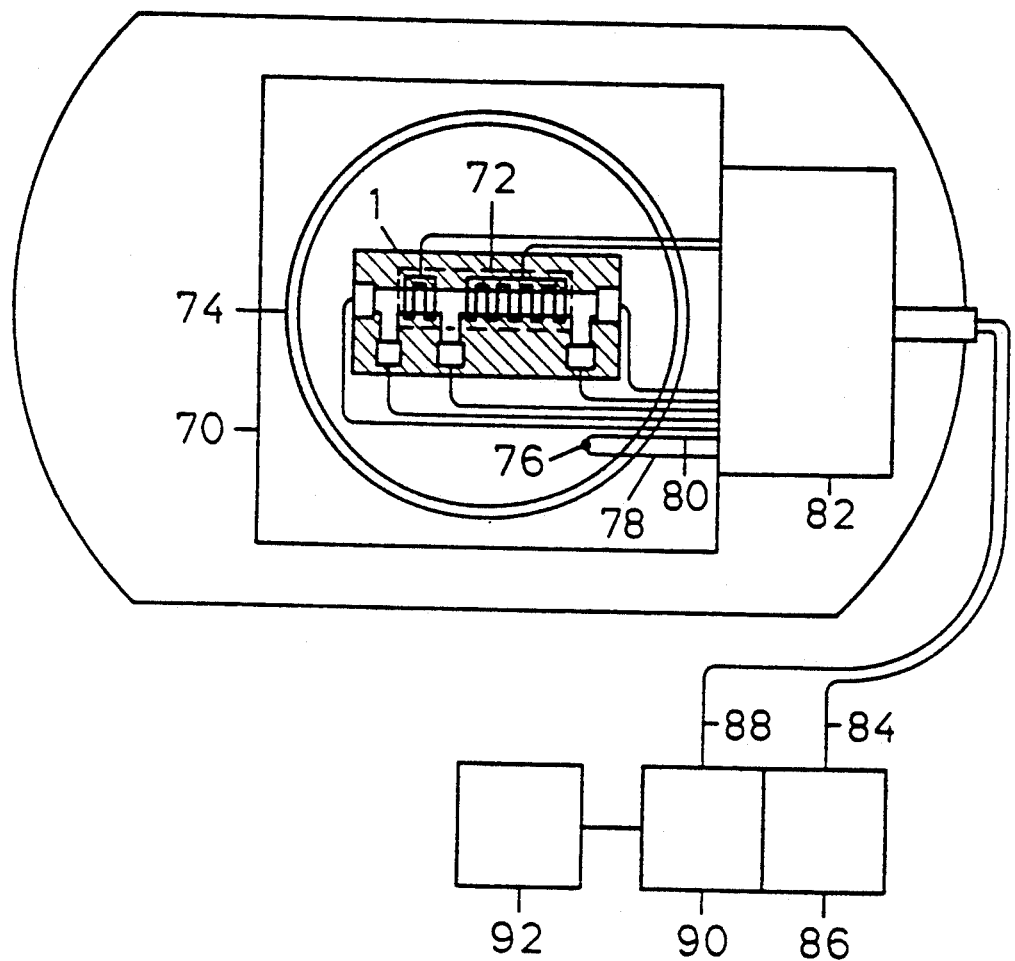
FIG. 8 is a schematic illustration of the radiation detector of FIG. 5 in accordance with the invention but built into a cryostat.

FIG. 8 shows schematically the building of the semiconductor detector of FIG. 5 into a cryostat. The chip 1 is mounted on a stable holder 70 beneath a window 72 which transmits the radiation to be detected to the semiconductor radiation detector. When the detector is carried by a satellite or by a space vehicle then a cryostat is no longer necessary since the operating temperature in space lies at approximately 1° K.

The chip 1 is arranged within, or directly beneath, a coil 74 in the form of a closed loop which consists of a material which is superconducting at the operating temperature of the cryostat. In order to induce a current into this superconducting loop a conductor 76 extends perpendicular to the plane of the loop within the latter. The conductor 76 is connected via two feed lines 78 and 80 to an electronic system 82 which is supplied via the line 84 with current from a power supply 86. The conductor 76 in connection with the electronic control 82 is able to induce a current into the superconducting loop 74 and also to vary it in known manner. In this way the magnetic field B perpendicular to the plane of the loop 74, i.e. perpendicular to the surface of the chip 1, can be varied in order to tune the detector.

The contact electrodes and the gate electrodes of the detectors 2 and 3 are likewise connected via lines to the electronic system 82 which applies the necessary control potentials and carries out the resistance measurements. The results of the resistance of the measurement are received by a computer 90 via the line 88 which can further process the resistance values. The results of the processing by the computer are shown on the image screen 92 and can, if necessary, be printed out and stored.

At this point certain special variants of the subject of the application should be explained in more detail. It has already been mentioned that it is in principle possible to operate far infrared detectors in accordance with the invention in the adiabatic transport regime even without a magnetic field. A precondition for this is that the lateral width of the two-dimensional system (of the etched mesa bar or ridge) is so small that the two-dimensional system becomes a quasi one-dimensional system. For this case the one-dimensional sub-bands take over the function of the Landau levels. Instead of the spacing of the Landau levels (which is the same as the cyclotron energy) the energetic spacing of the one-dimensional sub--bands is determined solely by the now very pronounced lateral constriction of the system. The principal geometry with two gates, for example in accordance with FIG. 2, can be retained. Instead of the far infrared resonance at the cyclotron energy one would now observe a resonance at very low frequencies, the energetic position of which is determined by the lateral constriction of the original two-dimensional system.

One can realize excellent far infrared detectors in accordance with the invention with only one gate. For this there are two special possibilities. The first possibility is shown in FIG. 9.

Figure 9:
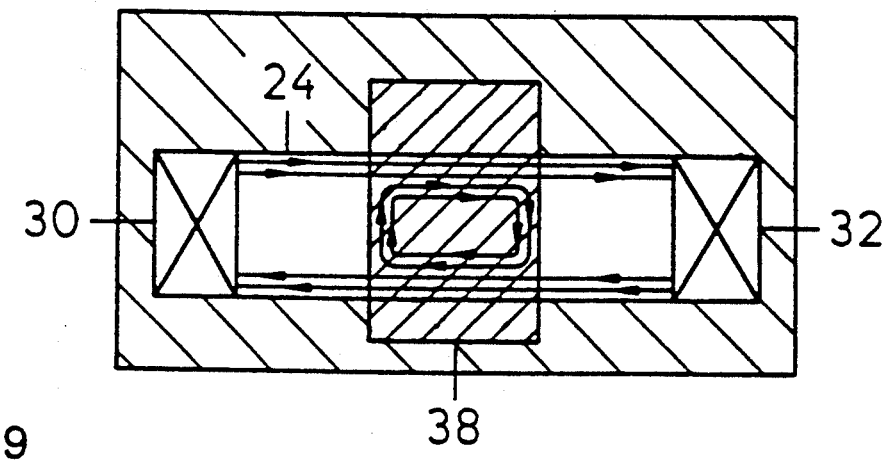
FIG. 9 is a further embodiment of an inventive radiation detector with a single gate electrode.

The embodiment of FIG. 9 is very similar to that of FIG. 7, however only a single gate electrode 38 is provided which is preferably centrally arranged and which is formed as a semi-transparent gate. This gate lies above the strip-like mesa ridge with parallel side edges and is formed as a Schottky gate. The reference numerals 30 and 32 here signify ohmic contacts which are necessary to carry out a 2-point-resistance measurement. The arrangement could however also be executed in accordance with FIG. 2 with further contacts 34, 36 for the purpose of carrying out a 4-point-resistance measurement. Semi-transparent gate electrodes are known and are achieved by using thin gate layers.

In this example a filling factor of 2 is achieved in the ungated region, whereas the filling factor in the gated region is 4, which is achieved by the application of a positive potential to the gate.

As with other structures a coupling in of the two (under the gate) orbiting edge states to the two transmitted edge states is possible. Without coupling one has adiabatic transport and with coupling equilibrated transport. The transition from adiabatic to equilibrated transport again results in a change of resistance.

Figure 10:
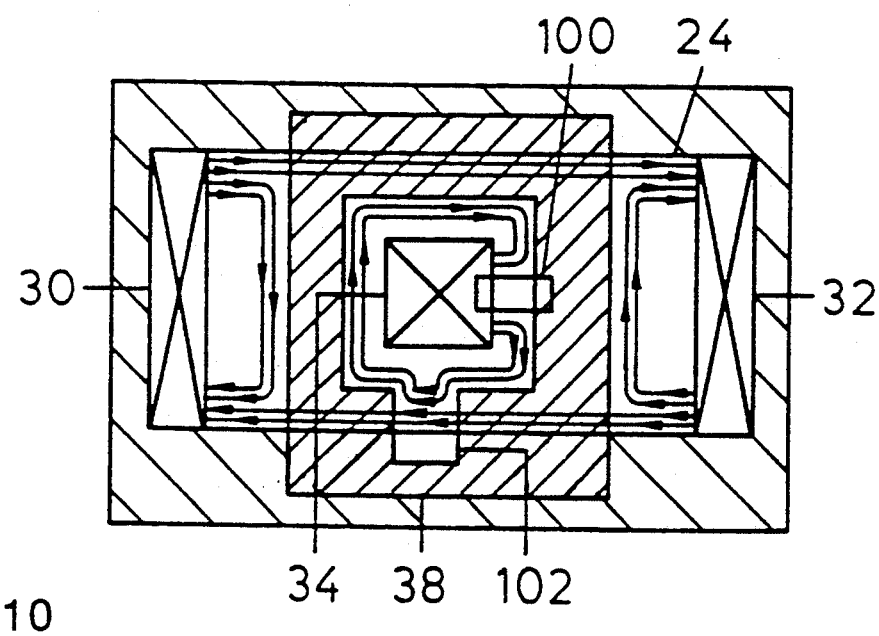
FIG. 10 is a modified embodiment of the radiation detector of FIG. 9.

The second possibility is shown in FIG. 10 and is similar to the embodiment of FIG. 9, at least in its basic concept. Stated more precisely the embodiment of FIG. 9 is modified in the following way and manner. First of all a hole, preferably a rectangular hole 100, is etched into the two-dimensional system, i.e. into the bar 24. In addition to the contacts 30 and 32 a third contact 34 is provided which is placed centrally in the bar 24 and realizes a contact to the 2DEG. One gate electrode 38 is then placed over the central region of the conductive bar 24 and has a cut-out, for example in the form of a keyhole 102, so that the third contact lies within the square part of the keyhole 102. A free space around the third contact 34 should now be present within the keyhole. The precise shape of the cut-out is not critical; it could also have a square shape. One notes that the etched away rectangle 100 extends from the third contact 34 beneath the gate electrode 38.

The current I flows between the contacts 30, 32 while a potential U 34, 32 is applied between the third contact 34 and the second contact 32. A filling factor 4 arises in the non-gated region and a filling factor 2 beneath the gated region.

As in FIG. 9 the incident far infrared radiation at the cyclotron energy also leads from the transition from adiabatic transport to equilibrated transport. This again results in a resistance change of 30, 32; 34, 32. The formulae named in this application do not apply for this geometry, however analog formulae can be derived. Both the embodiment of FIG. 9 and also the embodiment of FIG. 10 are intended for the operation with a magnetic field applied perpendicular to the plane of the drawing.

Figure 11:
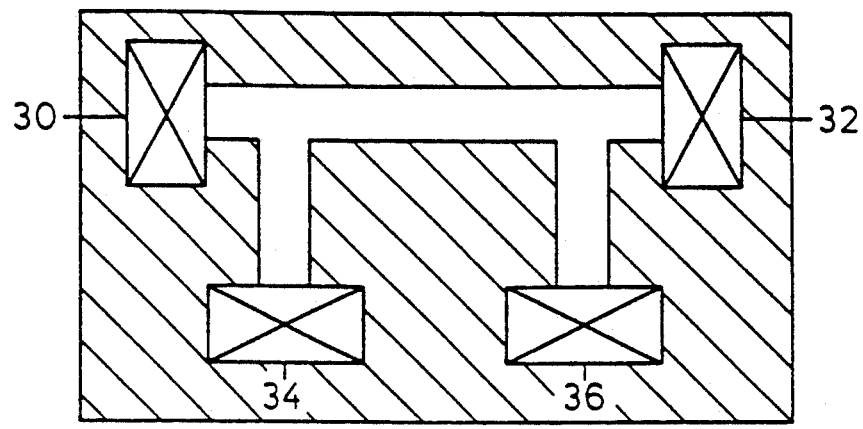
FIG. 11 is a further embodiment of a radiation detector in accordance with the invention with four contacts but with no gate electrode.

In addition to the previously presented methods with one or more gates there is also a possibility which is very interesting for the envisaged applications of using a structure without any form of gate. An example of this kind is shown in FIG. 11 and is very similar to the example of FIG. 3, however the gate structure 38, 44, 40 and 46 is omitted.

One is concerned here with a high mobility 2DEG. A measurement is made of $R_{30,32;34,36}$ - as in other structures. A structure of this kind is very sensitive to cyclotron resonance photons in the following filling factor regions and thus also magnetic field regions:

$7 > \nu > 6$ $5 > \nu > 4$ $3 > \nu > 2$

Within these three frequency windows the detector is again also tunable via the magnetic field. The physical process involved here is again a transition between adiabatic and equilibrated transport. This identification of the physical process results from the same current and temperature dependence of the resistance $R_{30,32;34,36}$ in these three magnetic field windows analogous to the adiabatic transport described in reference [11].

Figure 12:
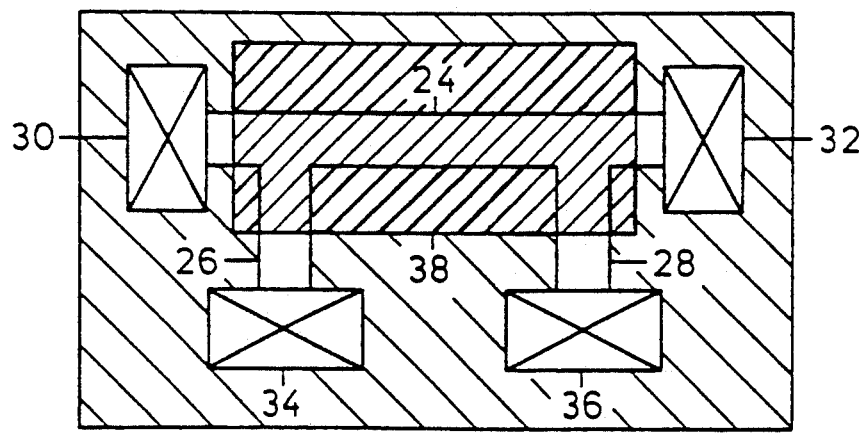
FIG. 12 is a modified embodiment of the radiation detector of the invention of FIG. 11 but with a single gate electrode.

The disadvantage of this detector, namely that only three windows are present here which do not overlap, so that the detector cannot be continuously tuned with the magnetic field, can be avoided if one applies an additional gate electrode. This additional gate electrode has the function of changing the carrier density. By changing the carrier density the three filling factor windows at which the detector is sensitive are shifted to higher or lower magnetic fields depending on the sign of the applied potential. In this way one can also achieve continuous tunability, i.e. tunability throughout a continuous frequency range. It is possible to understand why one can observe adiabatic transport also with ungated samples if one assumes that intrinsic barriers are present in the semiconductor material which now take over the function of the gate fingers. There are also two possibilities of realizing this structure with an additional gate electrode. The first possibility is shown in FIG. 12 in which the structure of FIG. 11 is provided with a semi-transparent top gate 38 which not only covers the central region of the conducting strip 24 but also partly covers the two limbs 26 and 28.

One can however also operate with a second possibility, namely with a so-called "Backgate". For this purpose one must grind down the sample structure of FIG. 11 to a thickness of ca. 150 μm in the growth direction. This structure is then bonded, for example with a conductive silver adhesive onto a gold layer. This gold layer then serves as an electrode at the backside. Through the application of a gate potential between this backside electrode and the 2DEG one can then change the carrier density of the 2DEG.

For the sake of completeness the physical background will now be explained in more detail with reference to experiments which have been carried out with the semiconductor radiation detectors of the invention, and also with reference to FIGS. 13 to 16, which also gives details of scientific publications which serve for a better understanding of the invention.

Two-dimensional electron gases in high mobility AlGaAs/GaAs heterostructures are of interest for far infrared photoconductors because the photoresponse behavior in strong magnetic fields is determined by the sharp ($\Delta < 1 cm^{-1}$) and tunable cyclotron resonance ($\hbar \omega_c \alpha B$).

In contrast to earlier work on photoconductivity in GaAs/AlGaAs heterostructures [1,2,3,4] measurement results will be presented in the following for a novel concept of cyclotron resonance (CR) photoconductivity which makes use of the electron density discontinuities which are induced by metallic front gates on the sample. The basic idea follows from the edge channel model [5,6] of the Quantum Hall effect which, in this transport regime, is used [7] for the interpretation of the results on these investigated samples. The aim of this explanation is to show that the sensitivity of these new photoconductors can be increased by more than an order of magnitude in comparison to homogeneous samples. In addition the evaluation of the experimental results within the framework of the edge channel model leads to new insights into the electronic processes which lead to photoconduction.

Within the Landauer-Büttiker-description [5,6] of the Quantum Hall effect the current is carried via one-dimensional currents located at the boundary of the sample, as schematically illustrated in FIG. 2 by the reference numeral 28. The number of these edge channels is given by the filling factor. The direction of the current flow is determined by the direction of the magnetic field, so that currents on opposite sides flow in opposite directions. The net current through the sample is established by the difference of the currents at these opposite edges. Ideal ohmic contacts acting as metallic election reservoirs with the electrochemical potentials $\mu_j$ feed the edge channels on one edge equally up to $\mu_j$ [8]. The edge channels flowing out of this contact carry the current [8].

$$I_{out(j)} = N \cdot \frac{e}{h} \cdot \mu_j \qquad (1)$$

where N is the number of the edge channels. The transport regime, where strong inter edge channel scattering leads to the same $\mu_j$ of adjacent edge channels, is denoted as equilibrated. In contrast adiabatic transport is characterized by the absence of inter edge channel scattering maintaining an unequal current distribution among the channels.

In the radiation detector described here, e.g. in accordance with FIGS. 1 and 2 adiabatic transport can be realized by a selective population of the edge channels by the means of Schottky gates. The electron density underneath the gates can be adjusted in such a way that the upper edge channels are reflected at the gate boundaries. In FIG. 2 this situation is sketched for filling factor $\nu_b=4$ in the ungated region and $\nu_g=2$ underneath the gates 38 and 40 (spin is neglected). Under this condition the current in the region between the gates is only carried by the lower edge channel (spin degenerate). Then in the absence of inter edge channel scattering the upper edge channel between the two gates is decoupled from the lower one. This means that the $\nu_j$ of the upper channel on opposite sides of the sample are equal. Therefore, it carries no current. An equilibration (scattering) process between the lower and the upper edge channel leads to a difference in $\nu_j$ within the upper channel on the opposite edges. This is reflected in an enlarged longitudinal magnetoresistance. The basic idea of the present proposal is that FIR cyclotron resonance photons should couple the lower to the upper edge channel and increase the magnetoresistance from the adiabatic to the equilibrated value. For integer filling factors in the ungated and the gated regions, respectively one calculates the adiabatic four-terminal resistance of the geometry in FIG. 2 by the equation A:

$$R^{ad}_{30,32;34,36} = \frac{h}{e^2}\left(\frac{1}{\nu_g} - \frac{1}{\nu_b}\right) \quad (A)$$

In this notation the current is applied between the contacts 30 and 32, whereas the voltage drop is measured between the contacts 34 and 36.

Figure 13:
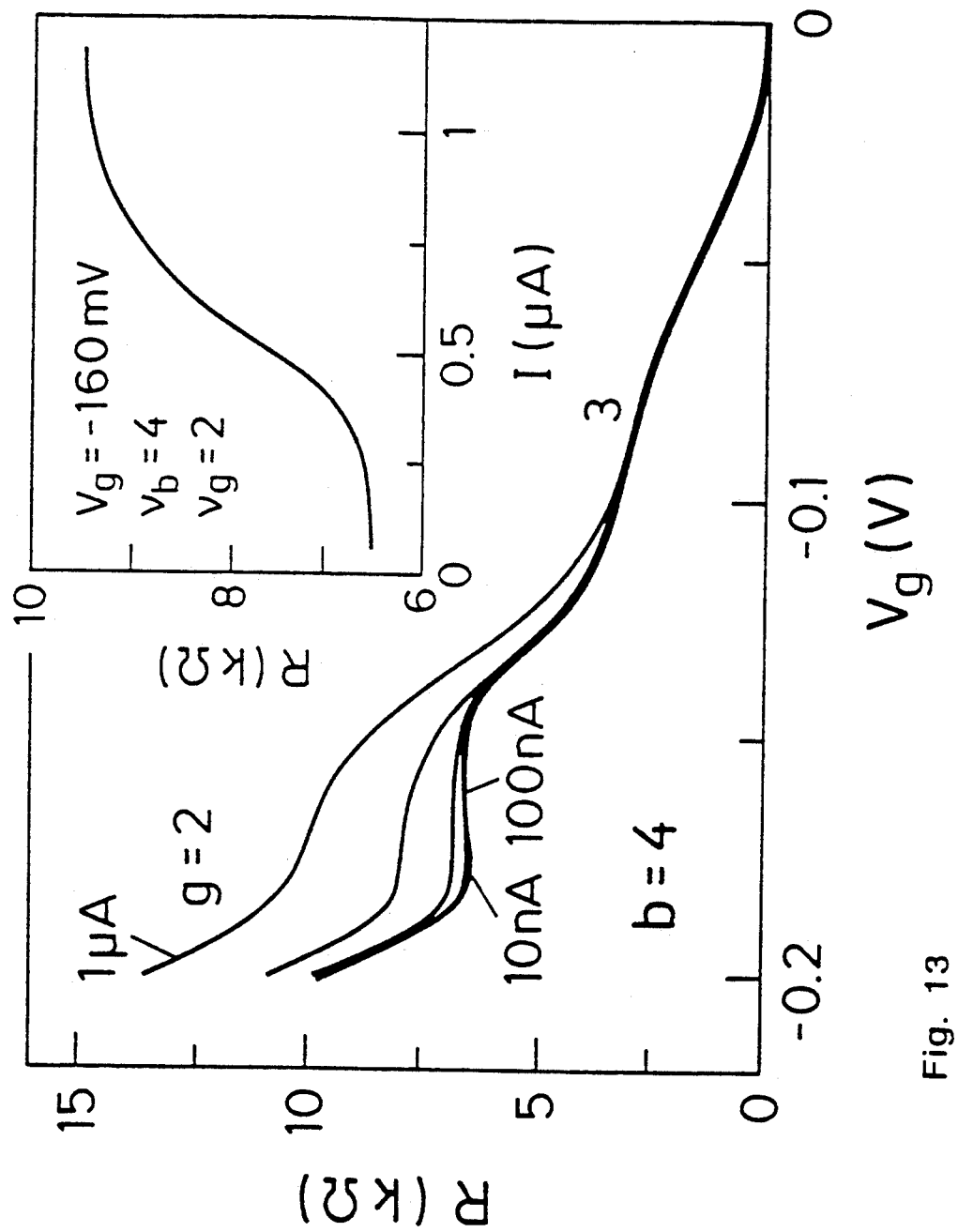
FIG. 13 is a graph to prove the existence of adiabatic transport in a semiconductor radiation detector in accordance with the invention.

Measurement results for R (in kiloohms) as a function of the gate electrode potential $V_g$ in volts are shown in FIG. 13 (without irradiation by photons, current as parameter).

The same result applies for $R^{ad}_{30,32;34,36}$ of the four gate electrode finger structure of FIG. 4.

The resistance of the equilibrated transport is given by $$R^{eq}_{30,32;34,36} = N \cdot R^{ad}_{30,32;34,36} \quad (E)$$

Here N is the number of the fingers of the gate structure. From these two formulae it is clearly evident that one should expect an amplified photoresponse due to a larger N. Therefore samples were prepared with two and four gate fingers in accordance with FIGS. 2 and 4.

The basic material of the semiconductor components are, as explained with reference to FIG. 1, molecular beam epitaxy (MBE) grown AlGaAs/GaAs heterostructures with an electron density of $n_3=1.8-2.7.10^{11}/cm^2$ and a mobility of $\mu=0.6-1.2.10^6 Vs/cm^2$.

1000 Å thick NiCr/Au films as Schottky gates are evaporated on top of the etched Hall bar geometry to tune the electron density underneath. The samples were immersed in liquid helium and kept at a temperature of 1.3K. The magnetic field perpendicular to the samples is provided by a superconducting magnet. Parallel to the magnetic field the FIR beam of an optically pumped molecular gas laser is guided to the samples through lightpipes. For the measurements use was made of the $\lambda=211, 232, 287, 311$, and $392 \mu m$ laser lines. The intensities at the output of the lightpipes are in the range from $10 \mu W/cm^2$ to $100 \mu W/cm^2$. Above the samples a cold filter stops the blackbody radiation from the top of the cryostat. The photoconductivity measurements under FIR illumination were performed in AC technique. For this, the laser was chopped with 830 Hz while the current is modulated with 13 Hz. This additional lockin step (discrimination process) eliminates photovoltaic signals, which have been discussed in a recent paper The first step for the experimental realization of the presented concepts is to verify whether the transport is adiabatic. This has been done by resistance measurements according to (A) and (E) for integer filling factors $\nu_b, \nu_g$. In the experimental parameter range the results indicate nearly adiabatic transport. The same conclusion is drawn for noninteger $\nu_b, \nu_g$. Here, the sum of the resistances $R_{30,32;34,36}$ with only gate 38 operating and $R_{30,32;34,36}$ with only gate 40 operating exceed the value for the case, where a gate voltage is applied simultaneously to both gates. This is consistent with the behavior at integer $\nu_b, \nu_g$ in accordance with (A) and (E), and is thus also a proof of adiabatic transport.

The striking performance of the photoconductor and the proof for the concept described above are demonstrated in FIG. 14. Here, photoconductivity spectra $\Delta R_{30,32;34,36}$ for the two gate finger part of FIG. 2 are shown under three conditions. The spectacular amplification by more than one order of magnitude of the photoconductivity signal is evident by comparing the traces a and b. The first shows the signal, when no voltage is applied to the gates. For this homogeneous electron density in the 2DEG one observes a weak negative signal, which corresponds to a resonant CR heating. This conclusion is supported by measurements of the temperature dependence of the magnetoresistance in this magnetic field range. Trace b exhibits a strong positive signal for the case, that the gate voltage $V_g$ is applied to both gates as expected from our model. Similar amplification factors have been observed on different samples and laser lines as well.

The proof of the concept of the invention is demonstrated by the comparison of the signals, when the gate voltage is applied only to one gate and to two gates. If the voltage is applied only to one gate, there exist no decoupled topmost edge channel between the gates and we deal with equilibrated transport. Hence, an amplified photoresponse is not expected. This is confirmed by trace c, where the gate voltage is applied only to gate 38. The curve for gate 40 is identical and therefore omitted. The CR peak of b rises and is distinguished substantially from the peak of trace c. It is concluded that in the two gate case the CR photons raise the inter edge channel scattering rate monitored by the increase of the resistance.

Further support for the photoconductivity concept in the adiabatic transport regime is evident, if we apply the analysis of the transport data of Müller et al [11] to the current and temperature dependence of the photoresponse. For the two gate and the four gate structures at T=1.3K it is essential that the bias current is fixed well below $1 \mu A$ to get the optimum performance, as can be seen for the two gate finger structure of FIG. 15. Increasing the temperature from 1.3K to 4.2K at a fixed current of I=100nA reduces the photosignal by a factor of 2. These observations are consistent with the transport measurements [11]. The inventors have demonstrated that both the rise in current and the rise in temperature lead to an equilibration among the edge channels. Under these circumstances the possibility for a photon induced equilibration is reduced and one obtains a smaller photoresponse.

The photoresponse for FIG. 2 for a two gate finger structure can be enlarged by a factor of two by using the four gate finger structure of FIG. 4. For the two gate finger and the four gate finger structures an increase in resistance of about 7% was obtained for a laser intensity of about $10^{-5}$W/cm$^2$.

In the presented measurements the 232 μm laser line matches the CR at a filling factor in the ungated region $\nu_b=3.5$. The gate voltage $V_g=220$ mV sets the filling factor underneath the gate to $\nu_g=1$ at the CR position. These settings fulfill the two general requirements for an amplified photoresponse. At first, the filling factor $\nu_b$ has to be larger than 2, because the two lowest Landau levels are only separated by a spin gap. Here, no CR absorption is possible. This requirement was checked experimentally, where a laser line was selected for the CR at $\nu_b=2$. A small PC signal at $V_g=$OmV disappeared by tuning the gate voltage. Second, the filling factor $\nu_g$ has to be adjusted so that at least the topmost edge channel is decoupled from the others. This statement was verified by measuring the photoresponse for three different filling factors $\nu_b$ with the corresponding three different laser lines.

Figure 14:
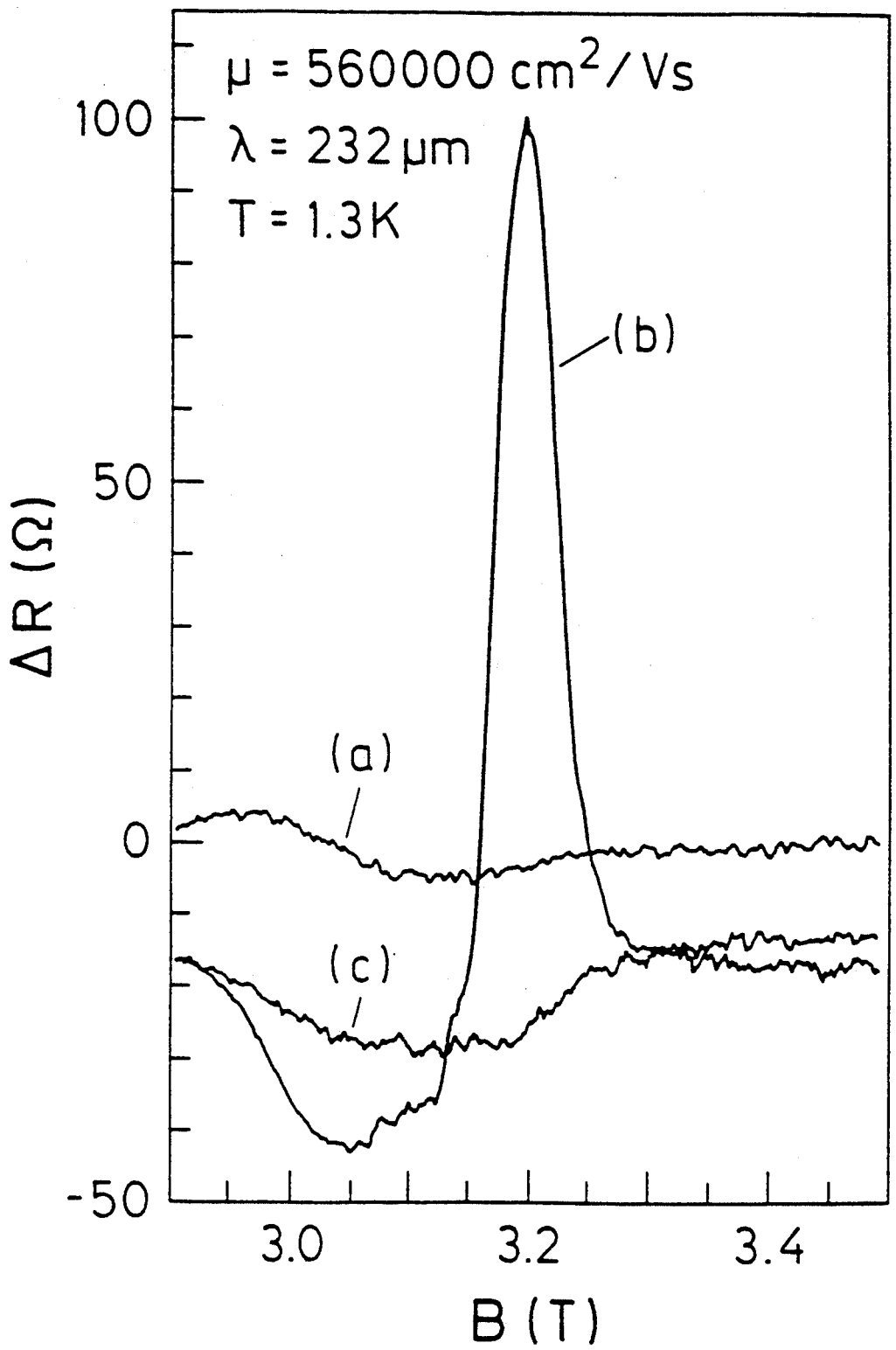
FIG. 14 is a graph to show the sensitivity of a semiconductor radiation detector in accordance with the invention.
Figure 15:
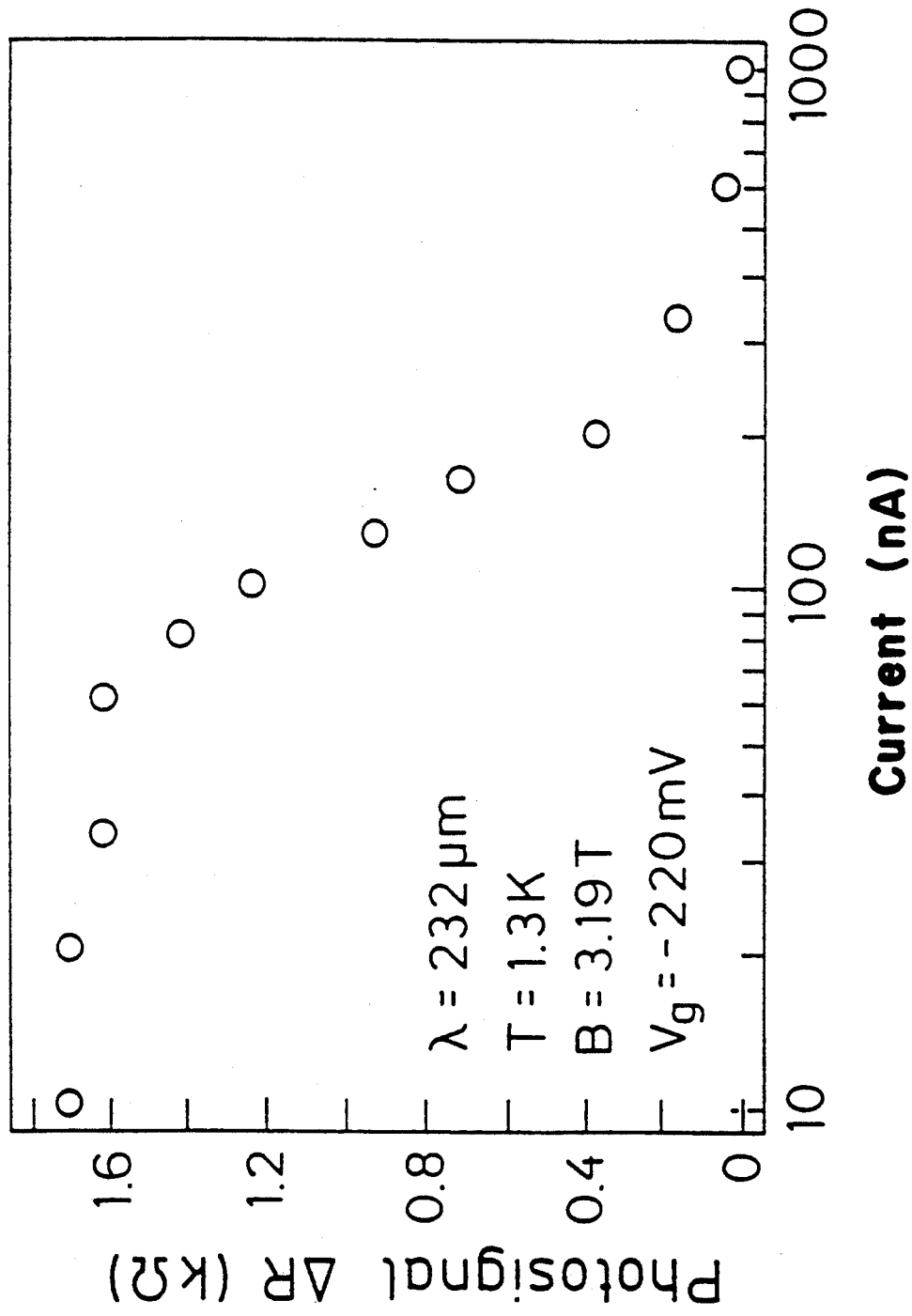
FIG. 15 is the induced change of resistance of a semiconductor radiation detector in accordance with the invention as a function of the measurement current, this curve shows how the maximum of the resistance curve b) of FIG. 14 depends on the measurement current and, FIG. 16 is the plot of the measured resistance a) when irradiation by photons, b) in the non-irradiated state.

With regard to the resonance position in FIG. 14 the same result was obtained in the photoconductivity and the corresponding transmission experiment.

Figure 16:
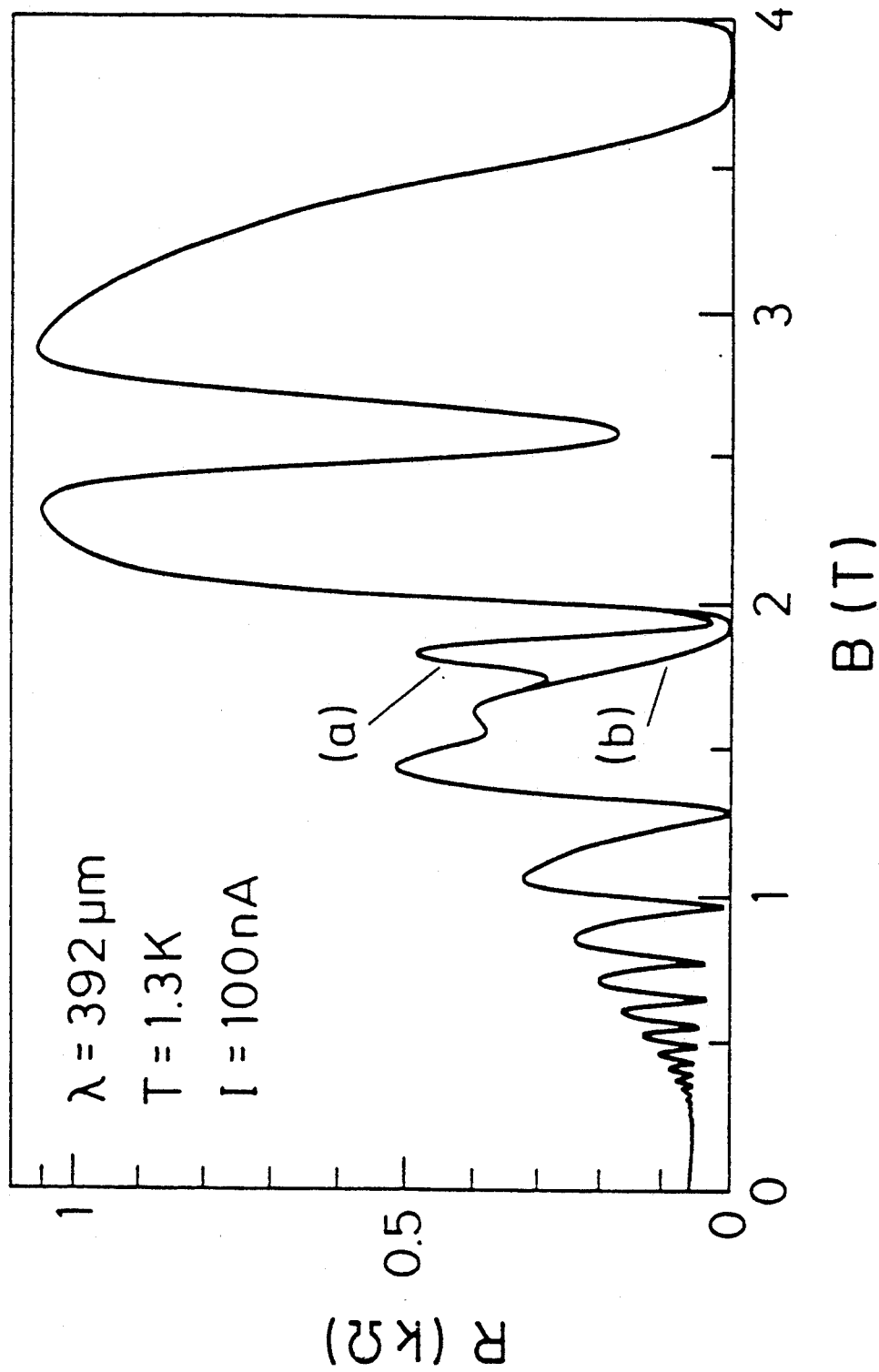

The sensitivity of the detector structure without Schottky gates in accordance with FIG. 11 was demonstrated in an impressive manner in FIG. 16. The irradiation by the 392 μm line led in curve a) to a large resonance at a magnetic field of 1.8T. Outside of the resonant magnetic field the resistances of the irradiated detector (curve a) were not substantially distinguished from those of the non-irradiated detector (curve b). In this way the narrow bandwidth of the detector was demonstrated.

In summary, it has been demonstrated that photon induced inter edge scattering is the dominant photoconductivity contribution in the presented multi gate finger structures. Although the photoconductor has to be operated at low temperatures and in the presence of a magnetic field the achieved responsivity of 6.10$^4$V/W favors the device for an application as a narrow band FIR detector. Due to the high sample quality the resolution at 3.2T is already $\tau/\Delta\tau=40$. For further improvement of the device the signal dependence on the number and the spacing of the gate fingers has to be investigated. In addition, higher sample mobilities and lower temperatures should raise the performance of the photoconductor, because adiabatic transport under these conditions is approached more closely.

References

[1] J.C. Maan, Th. Englert, D. C. Tsui, and A. C. Gossard, Appl.Phys. Lett. 40,609 (1982)
[2] D. Stein, G. Ebert, K. v. Kiltzing, and G. Weimann, Surf. Sci. 142,406 (1984)
[3] R. E. Horstman, E. J. v. d. Broek, J. Wolter, R. W. van der Heijden, G. L. J. A. Ridden, H. Sigg, P. M. Frilink, J. Maluenda, and J. Halais, Solid State commun. 50,753 (1984)
[4] M. J. Chou, D. C. Tsui, and A. Y. Cho, Proc. of 18th Intl. Conf. on the Phys. of Semiconductors (World Scientific, Singapore, 1986), Stockholm, Sweden, 1986, p. 437
[5] R. Landauer, IBM J. Res. Dev. 1,223 (1957)
[6] M. Buttiker, Phys. Rev. Lett. 57, 1751 (1986)
[7] G. Muller, D. Weiss, S. Koch, K. v. Kiltzing, H. Nickel, W. Schlapp, and R. Losch, Phys. Rev. B 42, 7633 (1990)
[8] M. Buttiker, Phys. Rev. B 38, 9375 (1988)
[9] B. V. Alphenaar, P. L. McEuen, R. G. Wheeler, R. N. Sacks, Phys. Rev. Lett. 64, 677(1990)
[10] C. T. Liu, B. E. Kane, D. C. Tsui, and G. Weimann, Appl.Fhys. Lett 55,162 (1989)
[11] G. Miiller, D. Weiss, S. Koch, K. v. Kiltzing, H. Nickel, W. Schlapp, and R. Losch, Proc. of 20th Intl. Conf. on the Phys. of Semiconductors, Thessaloniki, Greece, 1990, to be published
[12] R. J. Haug and K. v. Klitzing, Europhys. Lett. 10,489 (1989).

What is claimed is:

1. Semiconductor radiation detector having a layered construction and comprising a conductive region having a two-dimensional or quasi one-dimensional electron or hole gas in which an adiabatic transport takes place at least regionally in edge channels, and with at least two contacts to the conductive region, wherein the transport in the edge channels is disturbed by interaction with the electromagnetic radiation to be detected so that an increase of the scattering rate between the edge channels is caused to change the resistance measurable between the contacts, and means for detecting the change in resistance.

2. Semiconductor radiation detector in accordance with claim 1, including means for generating a magnetic field which has at least one component which can be applied perpendicular to the electron or hole gas, i.e. to the layers, wherein the magnetic field brings about a reduction of the scattering between the edge channels in the non-irradiated state of the detector.

3. Semiconductor radiation detector in accordance with claim 2, wherein the component of the magnetic field has a predetermined strength in the range of up to approximately 15 Tesla, in particular approximately 3 Tesla.

4. Semiconductor radiation detector in accordance with claim 2, including means for changing the strength of the magnetic field.

5. Semiconductor radiation detector in accordance with claim 2, wherein the means for generating the magnetic field is a coil.

6. Semiconductor radiation detector in accordance with claim 1, wherein said contacts are formed by first and second contacts which are provided spaced apart from one another at respective ends of the conductive region, and wherein at least one gate electrode is provided which is arranged between the first and the second contact and which covers the conductive region over a part of its length.

7. Semiconductor radiation detector in accordance with claim 6, wherein a second gate electrode is provided which, at a spacing from a first gate electrode, covers the conductive region over a further part of its length, the adiabatic transport being realized between the gates.

8. Semiconductor radiation detector in accordance with claim 7, wherein at least one further gate electrode is provided.

9. Semiconductor radiation detector in accordance with claim 8, wherein the gate electrodes form a periodically applied gate structure which serves as a grid coupler and brings about a change of resistance through magnetoplasmon coupling.

10. Semiconductor radiation detector in accordance with claim 1, wherein an additional gate electrode is provided on a lower side of the detector to which a variable potential can be applied.

11. Semiconductor radiation detector in accordance with claim 6, including means for applying a predeterminable potential to the gate electrode.

12. Semiconductor radiation detector in accordance with claim 1, wherein two further contacts are provided for carrying out a known 4-point measurement of the resistance of the conductive region.

13. Semiconductor radiation detector in accordance with claim 1, including a layout adapted for the execution of a Hall measurement for the determination of the resistance of the conductive region.

14. Semiconductor radiation detector in accordance with claim 1, wherein several detectors are provided on a chip.

15. Semiconductor radiation detector in accordance with claim 1, wherein a plurality of gate electrodes are provided at intervals over said conductive region to form a gate structure, wherein a plurality of radiation detectors are provided on a chip, and wherein individual detectors are laid out for detecting radiations of different wavelength, for example through the use of at least one of gate structures with different dimensions, gate structures with different periodicity, by the application of different gate potentials, by the application of different magnetic fields and through the use of non-homogeneous magnetic fields.

16. Semiconductor radiation detector in accordance with claim 14, wherein the means for carrying out the resistance measurement is integrated on the chip.

17. Semiconductor radiation detector in accordance with claim 14, wherein a coil for generating a magnetic field is also integrated on the chip.

18. Semiconductor radiation detector in accordance with claim 1, wherein it is housed in a cryostat which maintains the working temperature below 4° K.

19. Semiconductor radiation detector in accordance with claim 1, including a window which permits access for the radiation to be measured to the conductive region.

20. Semiconductor radiation detector in accordance with claim 1, comprising the following layer build-up:
a buffer layer arrangement and an intrinsic GaAs layer with a thickness in the $\mu$m-range are first grown on a GaAs substrate by epitaxy,
an undoped $Al_xGa_{1-x}As$-spacer with a layer thickness in the 100Å- range is grown onto the intrinsic undoped GaAs layer,
followed by a further layer of the same material but with an impurity doping having a three-dimensional concentration of $2-7 \times 10^{18} cm^{-3}$, in the form of one of a homogeneous doping and a delta doping,
wherein a cover layer of undoped GaAs is grown onto this doped layer, and
contacts to the two-dimensional electron gas and also to gate electrodes are produced following photolithographic delimitation of the conductive region, in which the undesired regions are removed to a level beneath the two-dimensional electron gas which forms in the boundary region between the undoped GaAs layer and the $Al_xGa_{1-x}As$-spacer.

21. Semiconductor radiation detector in accordance with claim 1, including a conductive region having a quasi one-dimensional electron or hole gas, with the detector being operated without an applied magnetic field.

22. Semiconductor radiation detector in accordance with claim 6, wherein a single, centrally arranged gate electrode is provided and is executed as a semi-transparent gate electrode.

23. Semiconductor radiation detector in accordance with claim 22, wherein a gate electrode is made impermeable to light; wherein the semiconductor is etched away in the central part of a conductive region of the semiconductor in order to provide an aperture in the two-dimensional electron or hole gas; wherein a third contact is provided in addition to the first and second contacts, with the third contact being executed to the central region of the two-dimensional electron or hole gas and preferably partly extending around a part of the periphery of the said aperture; and wherein the gate electrode has a keyhole, the dimensions of which are larger than the dimensions of the third contact, with this gate electrode overlapping an end part of the first said aperture so that the aperture extends from the third contact through a free space between this third contact and the keyhole up to and beneath the gate electrode, with the transverse dimensions of the third contact transverse to the conductive region being smaller than the transverse dimensions of the conductive region.

24. Semiconductor radiation detector in accordance with claim 12, wherein the first contact and the second contact are arranged at opposite ends of a strip-like conductive region from which two limbs branch off which lead to third and fourth contacts, with a gate electrode being provided which partly overlaps the conductive region and the two limbs and is realized as a semi-transparent top gate.

25. Semiconductor radiation detector in accordance with claim 12, wherein the first contact and the second contact are arranged at opposite ends of a strip-like conductive region from which two limbs branch off which lead to third and fourth contacts, with a gate electrode being provided which partly overlaps the conductive region and the two limbs; and wherein the gate electrode is realized as a back gate, for example in that the semiconductor is ground away from the substrate side and is bonded by means of a conductive silver onto a gold layer.

26. Semiconductor component for detecting electromagnetic radiation, comprising:
a charge carrier layer configured to permit adiabatic transport in edge channels in the absence of electromagnetic radiation, wherein electromagnetic radiation incident on said charge carrier layer disturbs said adiabatic transport and causes an increased rate of scattering between said edge channels; and
means for detecting said increased rate of scattering and hence said electromagnetic radiation by the resulting change in electrical resistance.

27. Semiconductor component for detecting electromagnetic radiation, comprising:
a charge carrier layer configured to permit adiabatic transport in edge channels in the absence of electromagnetic radiation, wherein electromagnetic radiation incident on said charge carrier layer disturbs said adiabatic transport and causes an increased rate of scattering between said edge channels; and means for electrically detecting said increased rate of scattering and hence said electromagnetic radiation.

28. Semiconductor radiation detector in accordance with claim 1, wherein it is housed in a cryostat which maintains the working temperature below 2° K.

29. Semiconductor radiation detector according to claim 28 wherein it is housed in a cryostat which maintains the working temperature at 1.3° K.

30. Semiconductor radiation detector in accordance with claim 2, including means for changing the strength of said component of said magnetic field.

31. Semiconductor radiation detector in accordance with claim 2, wherein the conductive region of the detector lies transverse to the axis of said coil in a direct vicinity of said coil, and thus in a homogeneous magnetic field.

32. Semiconductor radiation detector in accordance with claim 5, wherein said coil is a superconducting coil.

33. Semiconductor radiation detector in accordance with claim 8, including several further gate electrodes arranged at regular intervals over the length of said conductive region.

34. Semiconductor radiation detector in accordance with claim 33, wherein said further gate electrodes have the same potential.

35. Semiconductor radiation detector in accordance with claim 33, including means for applying a predeterminable potential to at least one of said gate electrodes.

36. Semiconductor radiation detector in accordance with claim 9, including means for applying a predeterminable potential to said gate structure.

37. Semiconductor radiation detector in accordance with claim 14, wherein means for applying control potentials is integrated on said chip.

38. Semiconductor radiation detector in accordance with claim 17, wherein said coil is in the form of a superconducting loop.

* * * * *